United States Patent
Fu et al.

(10) Patent No.: US 10,438,843 B1
(45) Date of Patent: Oct. 8, 2019

(54) SEMICONDUCTOR DEVICE AND METHOD FOR FABRICATING THE SAME

(71) Applicant: United Microelectronics Corp., Hsinchu (TW)

(72) Inventors: Tzu-Hao Fu, Kaohsiung (TW); Ci-Dong Chu, Miaoli County (TW); Tsung-Yin Hsieh, Tainan (TW); Chih-Sheng Chang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 16/119,980

(22) Filed: Aug. 31, 2018

(51) Int. Cl.
| | |
|---|---|
| H01L 21/70 | (2006.01) |
| H01L 21/768 | (2006.01) |
| H01L 23/528 | (2006.01) |
| H01L 23/532 | (2006.01) |
| H01L 21/311 | (2006.01) |

(52) U.S. Cl.
CPC .... *H01L 21/7682* (2013.01); *H01L 21/31144* (2013.01); *H01L 21/7684* (2013.01); *H01L 21/76802* (2013.01); *H01L 21/76831* (2013.01); *H01L 21/76832* (2013.01); *H01L 21/76877* (2013.01); *H01L 23/5283* (2013.01); *H01L 23/53295* (2013.01); *H01L 21/76871* (2013.01)

(58) Field of Classification Search
CPC ............. H01L 21/764; H01L 21/7682; H01L 23/5226; H01L 21/76843; H01L 21/76802; H01L 29/4991; H01L 2221/1042; H01L 21/76289
USPC .................. 257/506, 508, 522; 438/634, 637
See application file for complete search history.

(56) References Cited

U.S. PATENT DOCUMENTS

| | | | |
|---|---|---|---|
| 7,943,480 B2 | 5/2011 | Edelstein et al. | |
| 8,470,685 B2* | 6/2013 | Torres ................. | H01L 21/7682 257/273 |
| 9,312,220 B2 | 4/2016 | Lu et al. | |
| 10,242,933 B2* | 3/2019 | Bonilla ............... | H01L 29/4991 |
| 2010/0230741 A1* | 9/2010 | Choi .................. | H01L 21/76229 257/324 |
| 2013/0320459 A1* | 12/2013 | Shue ................. | H01L 21/76283 257/392 |
| 2016/0093566 A1* | 3/2016 | Ting ..................... | H01L 23/5226 257/774 |
| 2018/0108596 A1* | 4/2018 | Bonilla ............... | H01L 29/4991 |

* cited by examiner

*Primary Examiner* — S. V. Clark
(74) *Attorney, Agent, or Firm* — J.C. Patents (57) ABSTRACT

A structure of semiconductor device includes a substrate. A first dielectric layer is disposed over the substrate, wherein the first dielectric layer has an air trench. A plurality of trench metal layers is disposed in the first dielectric layer, wherein the air trench is between adjacent two of the trench metal layers and without contacting to the trench metal layers. A liner layer is disposed on the first dielectric layer to cover the trench metal layers and a profile of the air trench. An etching stop layer is disposed on the liner layer, wherein the etching stop layer seals the air trench to form an air gap between the adjacent two of the trench metal layers.

20 Claims, 10 Drawing Sheets

FIG. 4L

SEMICONDUCTOR DEVICE AND METHOD FOR FABRICATING THE SAME

BACKGROUND

1. Field of the Invention

The present invention generally relates to semiconductor fabrication technology, and particularly to the structure and fabrication method for the semiconductor device having air gap between connection nodes.

2. Description of Related Art

As integration of integrated circuit is significantly improved, the device size is accordingly reduced. Although the semiconductor structure can be stacked up at the vertical direction over the substrate, the area occupied the semiconductor device should be also reduced. As the device size is greatly reduced, a distance between the interconnect lines distributed at the horizontal direction is inevitably reduced as well.

As usually known, the interconnect lines are isolated by the inter-layer dielectric layer, such as oxide or nitride or the combination of multiple dielectric materials. Once the device size is reduced, the distance between the interconnect lines is then accordingly reduced. In this situation, a parasitic capacitance effect would occur between the interconnect lines and could influence the performance of the integrated circuit.

Howe to properly reduce the parasitic capacitance effect between the interconnect lines without causing damage to the device is an issue in fabrication.

SUMMARY OF THE INVENTION

In accordance with embodiments, the invention provides structure and fabrication method for the semiconductor device, at least being capable of properly reducing the parasitic capacitance effect between the interconnect lines without causing damage to the interconnect lines.

In an embodiment, the invention provides a structure of semiconductor device includes a substrate. A first dielectric layer is disposed over the substrate, wherein the first dielectric layer has an air trench. A plurality of trench metal layers is disposed in the first dielectric layer, wherein the air trench is between adjacent two of the trench metal layers and without contacting to the trench metal layers. A liner layer is disposed on the first dielectric layer to cover the trench metal layers and a profile of the air trench. An etching stop layer is disposed on the liner layer, wherein the etching stop layer seals the air trench to form an air gap between the adjacent two of the trench metal layers.

In an embodiment, as to the structure of semiconductor device, the high-K dielectric layer comprises an etching stop layer.

In an embodiment, as to the structure of semiconductor device, it further comprises a second dielectric layer, disposed on the etching stop layer.

In an embodiment, as to the structure of semiconductor device, it further comprises a stacked layer between the substrate and the first dielectric layer.

In an embodiment, as to the structure of semiconductor device, the stacked layer comprises a pre-layer metal layer or a pre-structure at a stage of middle end of line.

In an embodiment, as to the structure of semiconductor device, the trench metal layers have a flat top surface to join a top surface of the first dielectric layer.

In an embodiment, as to the structure of semiconductor device, the first dielectric layer is a low-K dielectric material.

In an embodiment, as to the structure of semiconductor device, a portion of the etching stop layer above the trench metal layer has a uniform thickness.

In an embodiment, the invention further provides a method for fabricating semiconductor device. The method comprises providing a substrate. The method further comprises the following steps. A first dielectric layer, a mask layer and a sacrificial layer are formed, sequentially stacked over the substrate. The sacrificial layer is patterned to form a plurality of mandrels on the mask layer. A spacer is formed on a sidewall of the mandrels. An etching process is performed to form a trench in the mask layer and the first dielectric layer, according to the mandrels with the spacer used as an etching mask. A plurality of trench metal layers is formed to fill the trench. A photoresist layer is formed on the trench metal layers and the mandrels, wherein the photoresist layer has an opening to expose a selected portion of the mandrels. The selected portion of the mandrels are removed to have an exposed region of the mask layer. An air trench is formed in the mask layer and the first dielectric layer from the exposed region of the mask layer. The photoresist layer is removed. The substrate is polished over until the first dielectric layer is exposed, wherein a remaining portion of the air trench is between adjacent two of the trench metal layers and without contacting to the trench metal layers. A liner layer is formed, being conformal over a profile of the air trench. A high-K dielectric layer is formed on the liner layer, wherein the air trench is sealed by the high-K dielectric layer to form an air gap.

In an embodiment, as to the method for fabricating semiconductor device, the etching stop layer comprises a high-k dielectric, a nitrogen doped SiC, an oxygen doped SiC, or an aluminum nitride.

In an embodiment, as to the method for fabricating semiconductor device, it further comprises forming a second dielectric layer on the etching stop layer.

In an embodiment, as to the method for fabricating semiconductor device, it further comprises forming a stacked layer between the substrate and the first dielectric layer.

In an embodiment, as to the method for fabricating semiconductor device, the stacked layer comprises a pre-layer metal layer or a pre-structure after a processing stage of middle end of line.

In an embodiment, as to the method for fabricating semiconductor device, the trench metal layers have a flat top surface to join a top surface of the first dielectric layer after the step of polishing over the substrate.

In an embodiment, as to the method for fabricating semiconductor device, the first dielectric layer is a low-K dielectric material.

In an embodiment, as to the method for fabricating semiconductor device, the mask layer on the first dielectric layer is a single-layer structure or a multiple-layer structure.

In an embodiment, as to the method for fabricating semiconductor device, the trench metal layers are copper.

In an embodiment, as to the method for fabricating semiconductor device, a portion of the high-K dielectric layer above the trench metal layer has a uniform thickness.

In an embodiment, as to the method for fabricating semiconductor device, a damage on the trench metal layers during the step of forming the air trench is excluded during the step of polishing over the substrate.

In an embodiment, as to the method for fabricating semiconductor device, the step of performing the etching process to form the trench comprises a first etching stage to etch the mask layer using the mandrels with the spacer as the etching mask, and a second etching stage to continuously etch down to the first dielectric layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to the fabrication technology of semiconductor device. To at least reduce the parasitic capacitance effect between interconnect lines or interconnection nodes, the invention takes a strategy to form an air gap between the interconnect lines, which are trench metal layers, generally. In this manner, a damage to the trench metal layers can be reduced.

Multiple embodiments are provided for descriptions of the invention. However, the invention is not limited to the embodiments.

Figure 1:
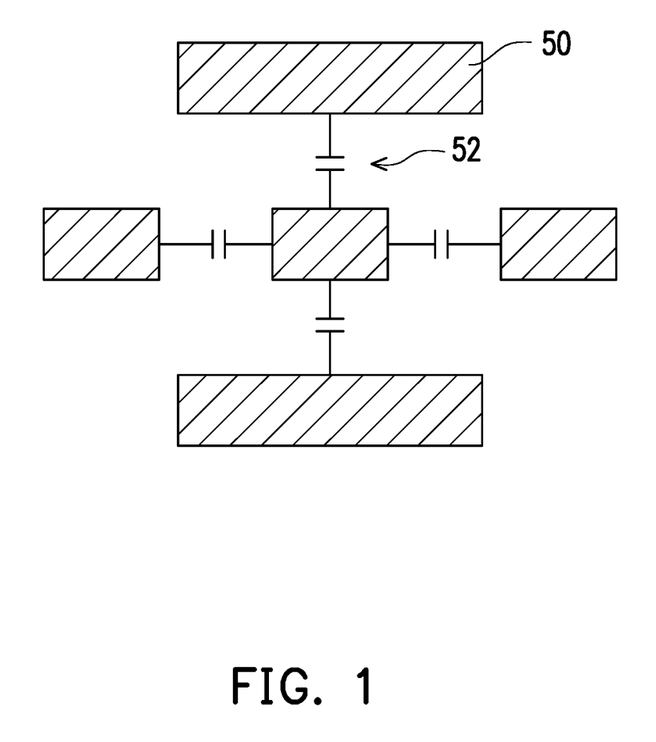
FIG. 1 is a drawing, schematically illustrating a layout of interconnect lines with the parasitic capacitors, according to an embodiment of the invention.

The invention has looked into the issue of parasitic capacitance effect between the interconnect lines or nodes. FIG. 1 is a drawing, schematically illustrating a layout of interconnect lines with the parasitic capacitors, according to an embodiment of the invention.

Referring to FIG. 1 interconnect lines (nodes) 50 are distributed as a metal layer. The interconnect lines 50 are isolated by dielectric material, formed as inter-layer dielectric layer. As previously mentioned, when the device sized is reduced, the distance between the interconnect lines 50 would be reduced, accordingly. As known, a parasitic capacitor 52 is more obviously existing between the interconnect lines 50. The parasitic capacitance is proportional to k/d, wherein k is the dielectric constant of the dielectric material and d is the distance between the interconnect lines. The parameter d gets small when the size is reduced.

To main small parasitic capacitance, it can be done by decreasing dielectric constant k, so to compensate the reduced distance d. To decrease the total dielectric material between the interconnect lines 50, and air gap with k=1 is expected to be formed between the interconnect lines 50.

The invention has looked into one manner to form the air gap between the interconnect lines 50 and observed some defects. FIG. 2A-FIG. 2D are drawings, schematically illustrating a fabrication flow to form an air gap between interconnect lines, according to an embodiment of the invention as looked into.

Figure 2A:
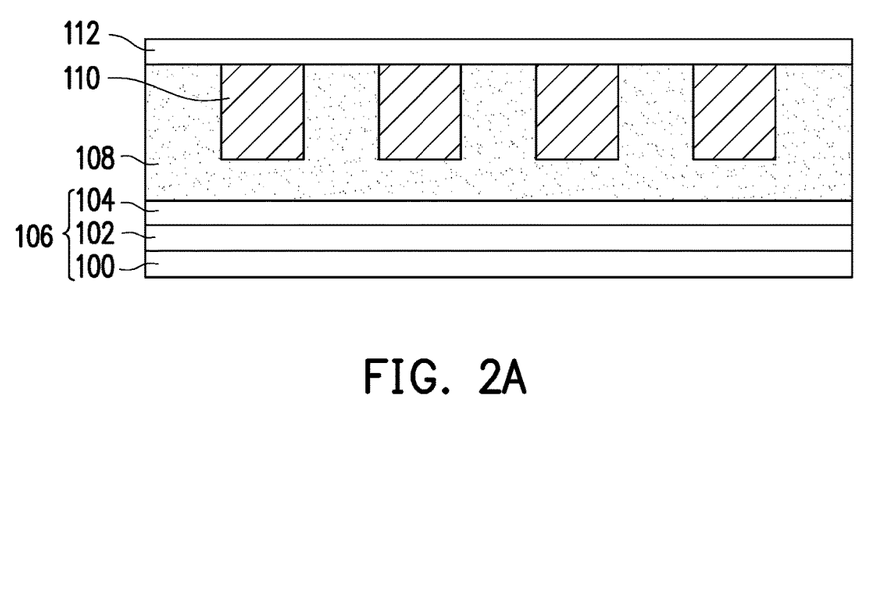
FIG. 2A-FIG. 2D are drawings, schematically illustrating a fabrication flow to form an air gap between interconnect lines, according to an embodiment of the invention as looked into.

Referring to FIG. 2A, a substrate 106 is provided as base for forming a trench metal layer 110, which can be the interconnect lines in an example but the invention is not limited to. The substrate 106 comprises silicon substrate 100. Further, due to the need in fabrication, some dielectric layer such as SiC layer 102 and/or tetraethoxysilane (TEOS) oxide layer 104 may be already formed on the silicon substrate 100. In other words, the substrate 106 may carry some sub-structure already formed during the processing stage of middle/front end of line. An inter-layer dielectric layer 108, such as silicon oxide layer, is formed on the substrate 106. The trench metal layer 110, such as tungsten layer filled into a trench of the inter-layer dielectric layer 108, is formed in the inter-layer dielectric layer 108 with a planarized surface. Then, a hard dielectric layer 112, such nitrogen-doped SiC (NDC), is further formed on the inter-layer dielectric layer 108 and the trench metal layer 110. The hard dielectric layer 112 is also serving as an etching stop layer for the post fabrication process.

Figure 2B:
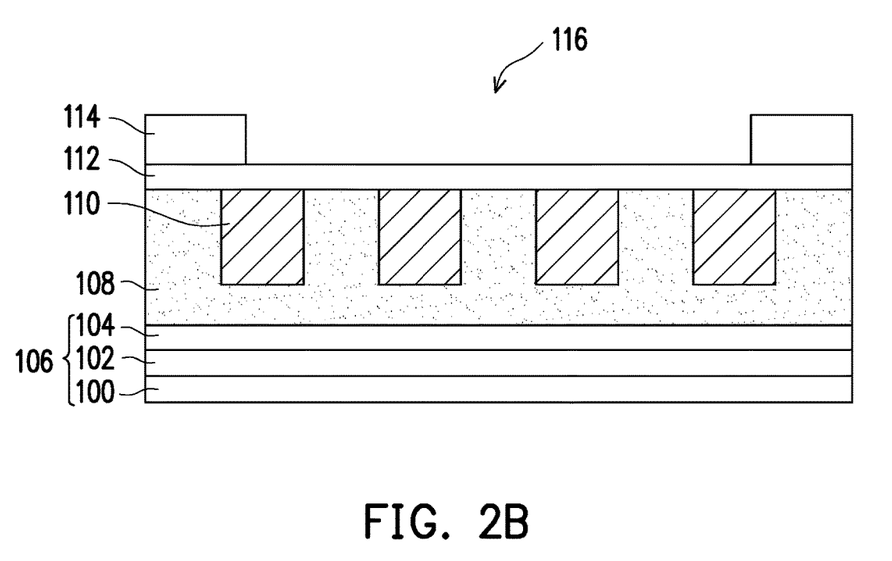

Referring to FIG. 2B, a photoresist layer 114 is form on the etching stop layer 112. The photoresist layer 114 has an opening 116 to exposed a portion of the hard dielectric layer 112, corresponding to some of the trench metal layers 110.

Figure 2C:
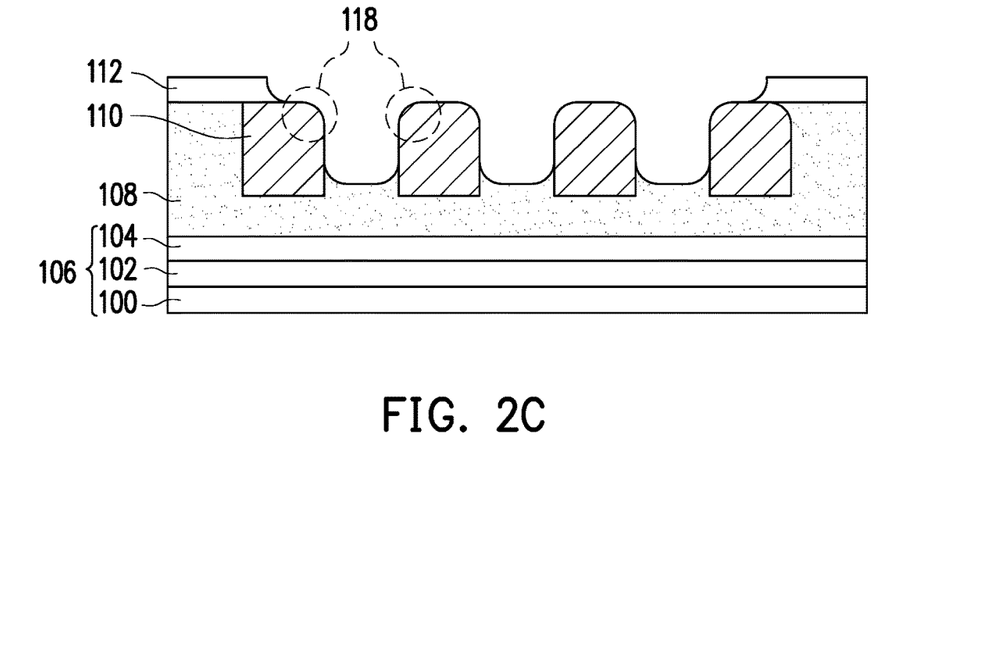

Referring to FIG. 2C, the photoresist layer 114 is used as an etching mask, a dry etching process is performed to each the hard dielectric layer 112 to expose the inter-layer dielectric layer 108. The inter-layer dielectric layer 108 is then further etched to have a trench between the trench metal layer 110. In this stage, a damage 118 may occur on the trench metal layers 110. The photoresist layer 114 is then removed after etching process.

Figure 2D:
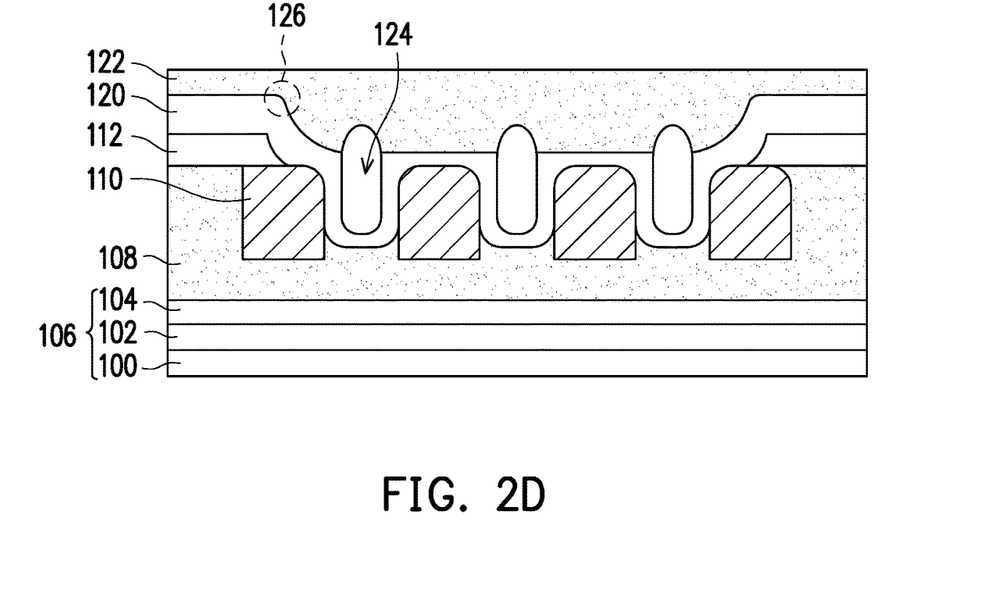

Referring to FIG. 2D, another hard dielectric layer 120 is additionally formed over the substrate, to cover the profile of the trench between the trench metal layer 110. So far, the trench is not fully filled by the hard dielectric layer 120. Then, another inter-layer dielectric layer 122 is formed over hard dielectric layer 120. The inter-layer dielectric layer 122 seals the trench to form an air gap 124 between adjacent two of the trench metal layers 110. In addition, the structure topography at the region 126 of the hard dielectric layer 120 with lower hard dielectric layer 112 is not uniform with respect to the other region. The parasitic capacitance effect in vertical direction is then also not uniform.

As observed by the invention, the fabrication method above may produce the air gap 124 to reduce the parasitic capacitance effect. However, some damage or defect to the device may occur. After looking into the issue in detail, the invention has proposed a structure of semiconductor device with air gap between the trench metal layers but the damage or defect of the device can be reduced.

Figure 3:
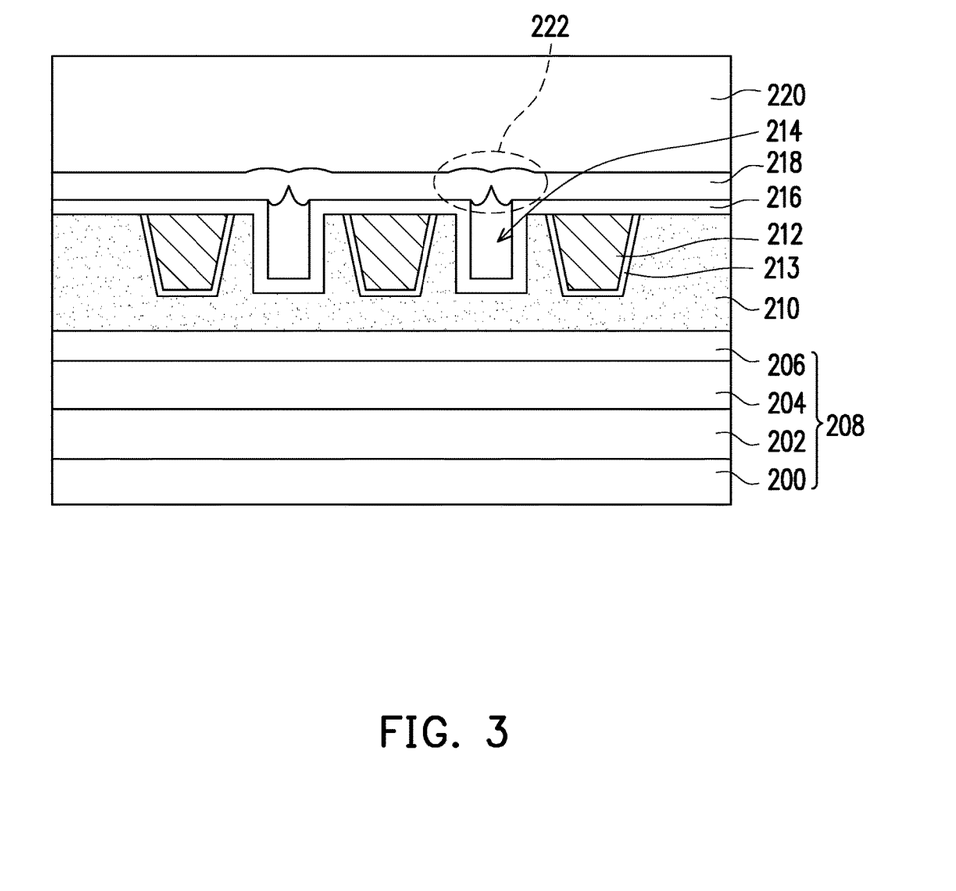
FIG. 3 is a drawing, schematically illustrating a cross-sectional structure of the semiconductor device with air gap between trench metal layers, according to an embodiment of the invention.

FIG. 3 is a drawing, schematically illustrating a cross-sectional structure of the semiconductor device with air gap between trench metal layers, according to an embodiment of the invention.

Referring to FIG. 3, based on the fabrication process as provided by the invention, a structure of semiconductor device can be achieved, which includes a substrate 208. The substrate 208 as previously stated, includes a silicon substrate 200 in an example. There may be multiple other structure layers 202, 204, 206, as actual need, formed on the silicon substrate 200 in a stack. However, the invention is not just limited to the embodiments.

A first dielectric layer 210 is disposed over the substrate 208, wherein the first dielectric layer 210 has an air trench 214. A plurality of trench metal layers 212 is disposed in the first dielectric layer 210, wherein the air trench 214 is between adjacent two of the trench metal layers 212 and without contacting to the trench metal layers 212. The trench metal layers 212 in an example is tungsten layers formed by plating and then polishing into flat plane. In plating process, the plating seed layer 213 is usually used to improve the plating performance. In other words, the seed layer 213 can be integrated into the trench metal layers 212 after plating.

A liner layer 216 is disposed on the first dielectric layer 210 to cover the trench metal layers 212 and a profile of the air trench 214. An etching stop layer 216 is disposed on the liner layer 216, wherein the etching stop layer 218 seals the air trench 214 at the region 222 to form an air gap between the adjacent two of the trench metal layers 212. After then, a second inter-layer dielectric layer 220 can be further formed on the etching stop layer 218 for the subsequent processes. Here, the etching stop layer 218 in an example can be a high-K dielectric layer, which can serve as an etching stop with respect to the subsequent fabrication processes. At the current stage, the high-K dielectric layer or the etching stop layer is referred, generally, without limiting a specific dielectric layer.

Figure 4A:
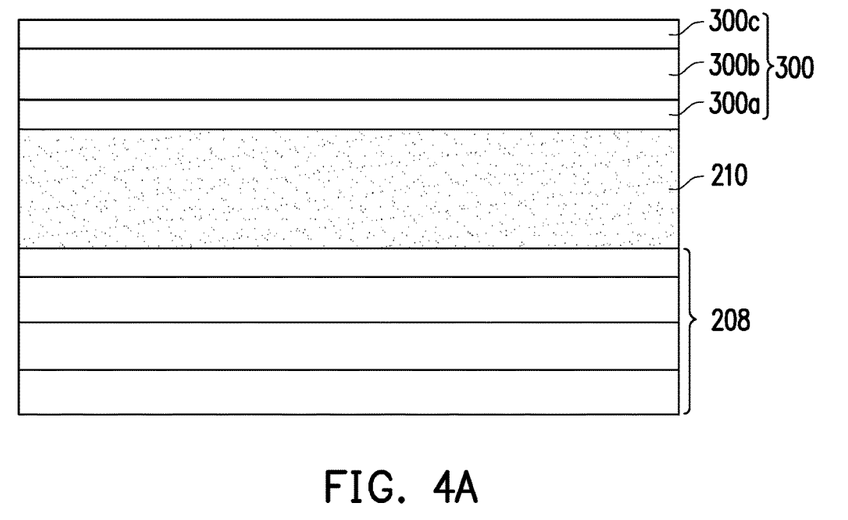
FIG. 4A-FIG. 4L are drawings, schematically illustrating a fabrication flow to form the structure in FIG. 3, according to an embodiment of the invention.

As to the fabrication, FIG. 4A-FIG. 4L are drawings, schematically illustrating a fabrication flow to form the structure in FIG. 3, according to an embodiment of the invention. Referring to FIG. 4A, the substrate 208 is provided. Then a first inter-layer dielectric layer 210 is formed on the substrate 208. A mask layer 300 is formed on the first inter-layer dielectric layer 210. The mask layer 300 in an example is a hard mask layer and can be a single-layer structure or a multi-layer structure. In the embodiment, the multi-layer structure is taken as an example, so the mask layer 300 include the middle mask layer 300b, serving as the main part. However, a bottom mask layer 300a and a top mask layer 300c may be further formed to improve the capability of the mask layer 300. It is not the only limitation in the invention.

Figure 4B:
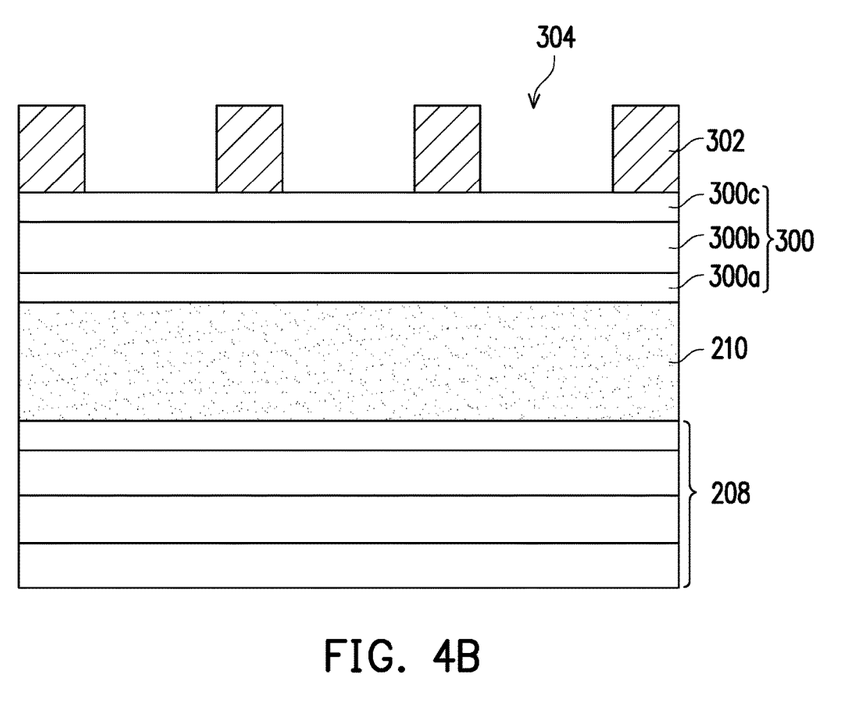

Referring to FIG. 4B, a plurality of mandrels 302 as a mandrel layer is formed on the mask layer 300. To form the mandrels 302, a sacrificial layer such as polysilicon layer is first formed on the mask layer 300 and is patterned into mandrels 302. A portion of the mandrels are used to form air trench and then the air gap in the subsequent fabrication processes as to be described later, so the locations of the mandrels are predetermined. The opening 304 between the mandrels are formed to expose the mask layer 300.

Figure 4C:
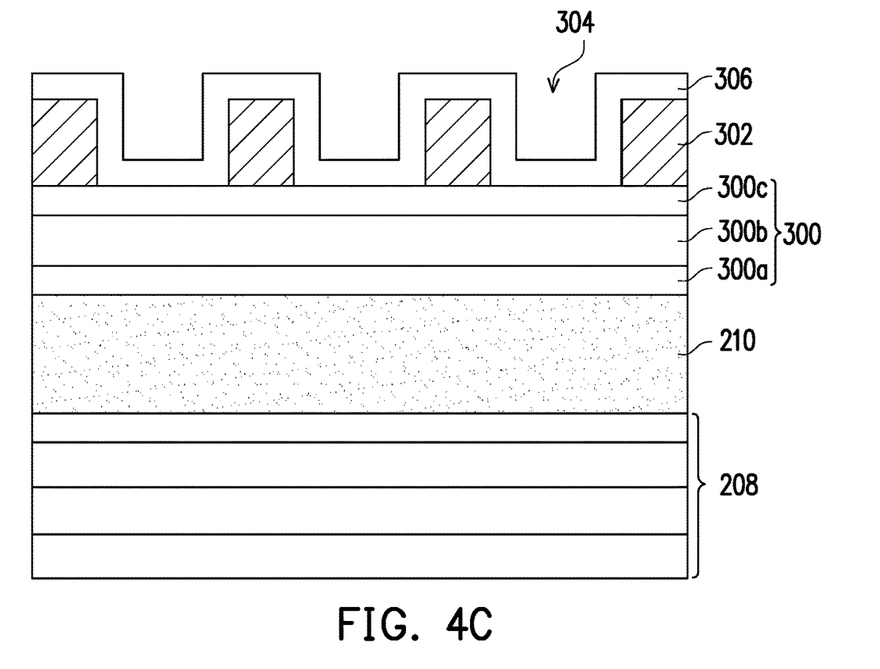
Figure 4D:
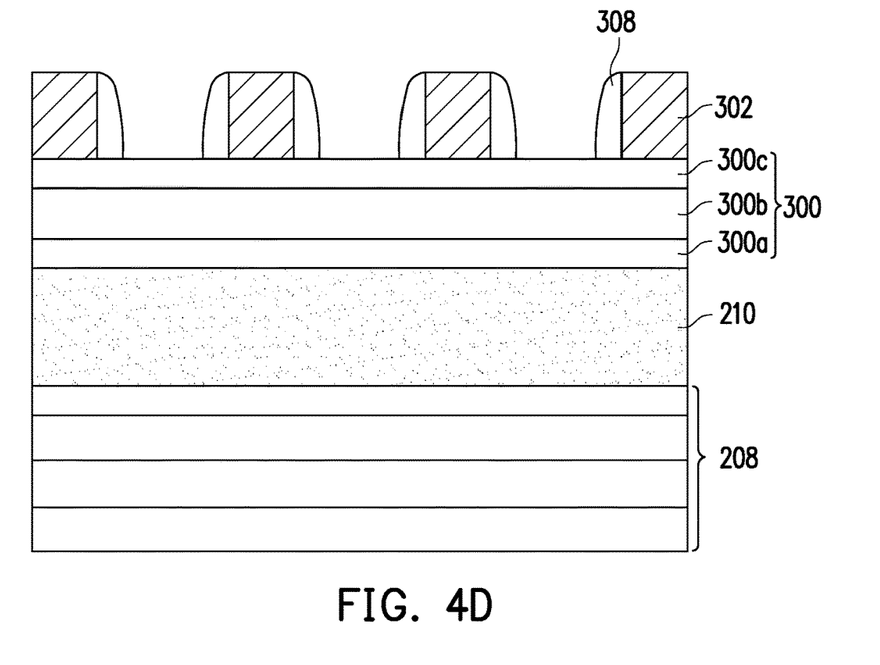

Referring to FIG. 4C, a dielectric layer 306 with a proper thickness is formed over the substrate in conformal structure. Referring to FIG. 4D, an etching back process is performed to remove the dielectric layer 306, in which a residual portion of the dielectric layer 306 for a spacer 308 on the sidewall of the mandrels 302.

Figure 4E:
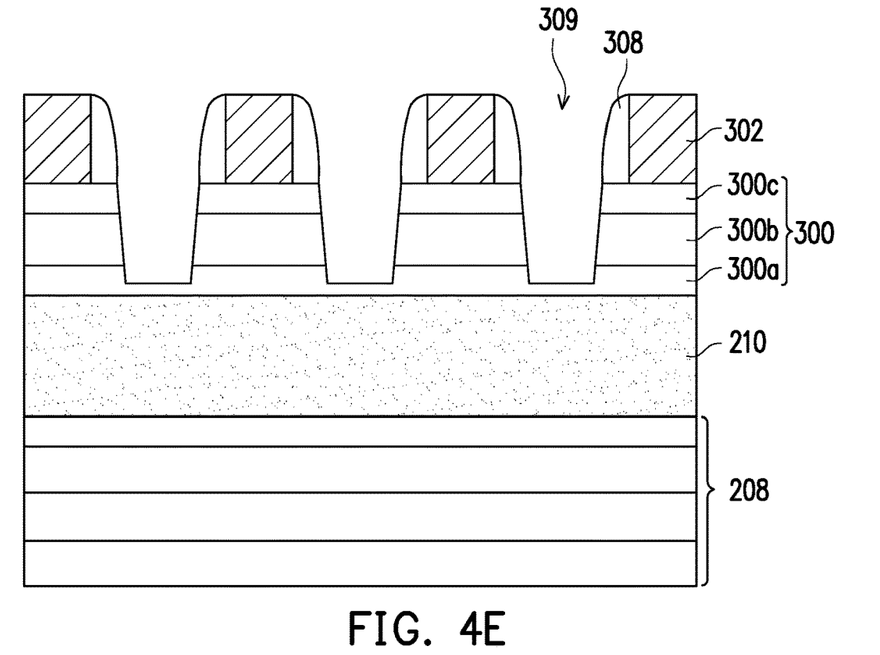
Figure 4F:
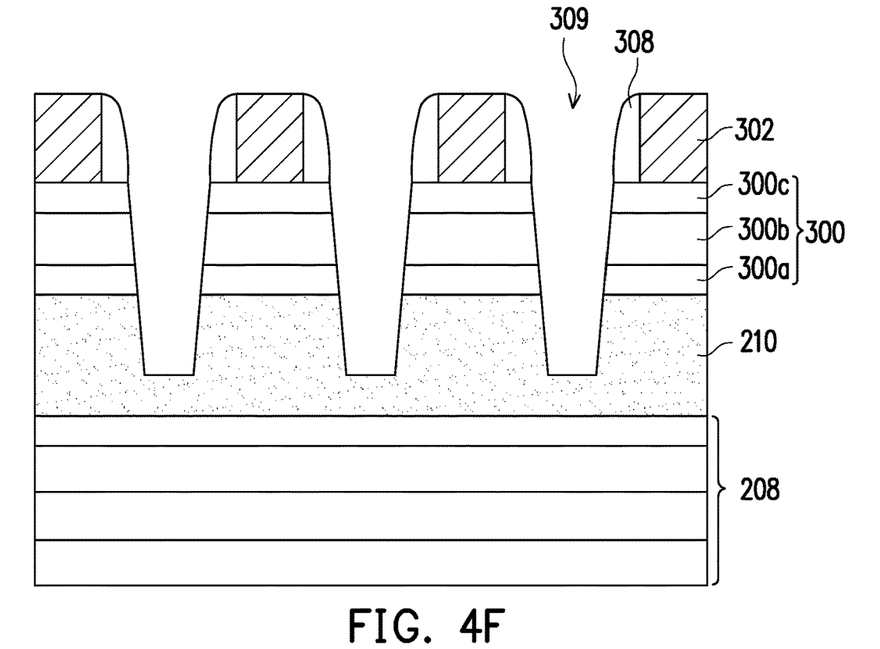

Referring to FIG. 4E, the mandrels 302 with the spacer 308 is used as an etching mask, so a first etching stage is performed to form a trench 309 in the mask layer 300 first. Referring to FIG. 4F, the second etching stage in an example due to different dielectric material is further performed to for the trench 309 extending to the inter-layer dielectric layer 210, which is oxide in an example. However, generally, the first etching stage and the second etching stage in an embodiment is stated as an etching process, which may include different stages for different material but not limited thereto.

Figure 4G:
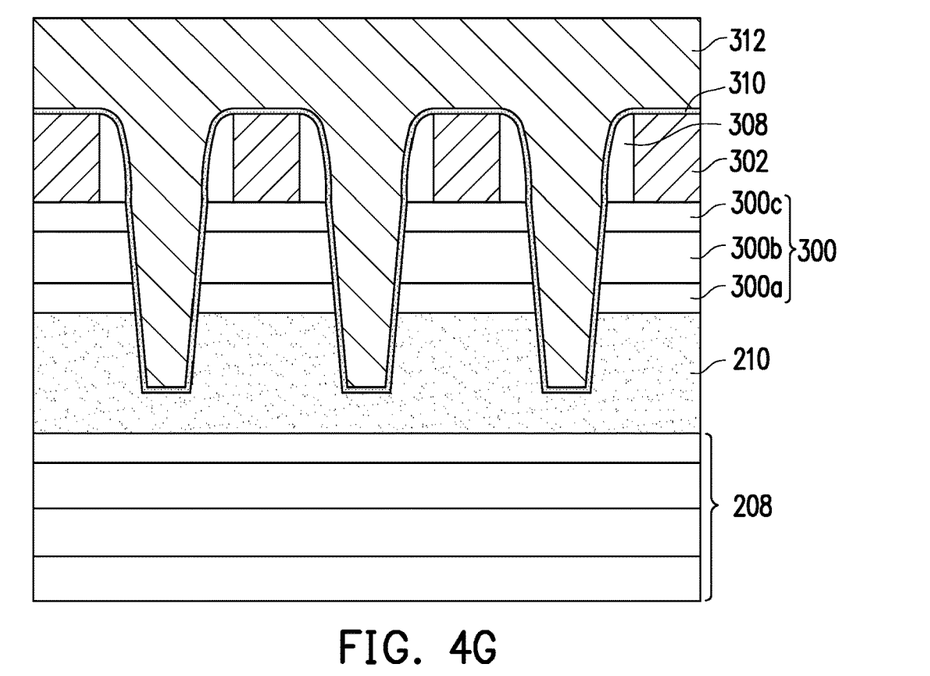

Referring to FIG. 4G, a metal layer 312 is formed over the substrate to fill the trench 309 in FIG. 4F. The metal layer 312 is used to form the interconnect structures at the end, in an embodiment. The material of the metal layer 312 is tungsten as an example. The tungsten is usually formed by plating process, in which a plating seed layer 310 may be formed first to improve the plating quality. In this manner, the plating seed layer 310 would be integrated into the metal layer 312.

Figure 4H:
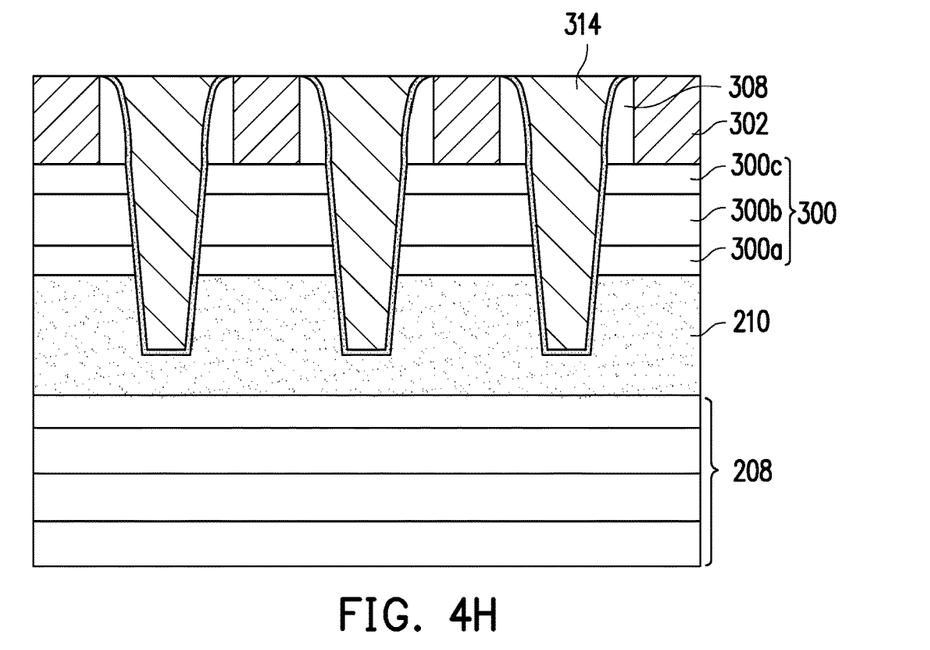

Referring to FIG. 4H, the polishing process is performed over the substrate to expose the mandrels 302. The metal layer 312 after the polishing process turns to a trench metal layer 314, which extends to the inter-layer dielectric layer 210.

Figure 4I:
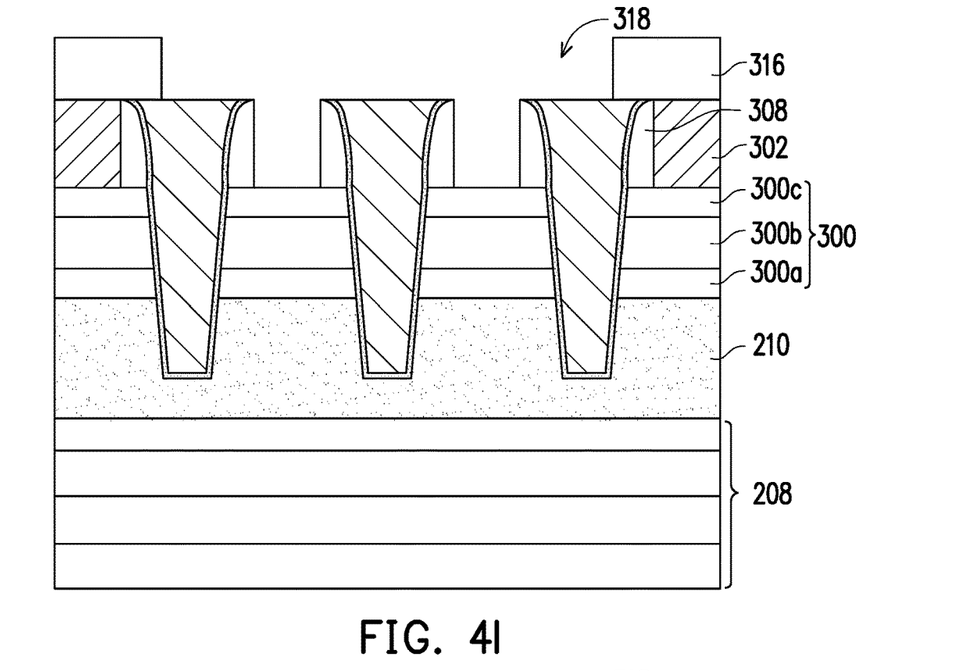

Referring to FIG. 4I, a photoresist layer is formed on the mandrels 302 and the trench metal layer 314. However, a selected portion of the mandrels 302 are exposed by an opening 318 of the photoresist layer 316. Then, the exposed mandrels 302 of polysilicon material in an example are removed by etching process. As a result, a region of the mask layer 300 is exposed due to removing the selected portion of the mandrels 302.

Figure 4J:
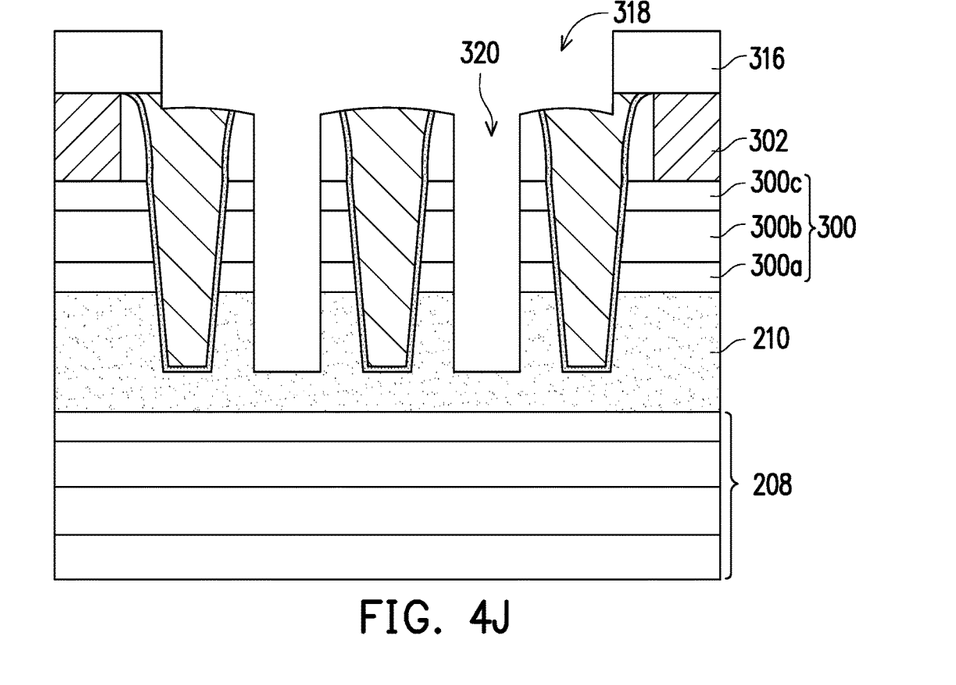

Referring to FIG. 4J, another etching process to the dielectric materials is performed to form an air trench 320, which is corresponding to the selected mandrels 302 as previously removed. The air trench 320 is to be formed into air gap later. In an example, it has the depth closing to the depth of the trench metal layer 314 but this is not the only limitation in the invention. As noted, the trench metal layer 314 may be damaged due to etching process. However, this damage can be effectively excluded as to be seen.

Figure 4K:
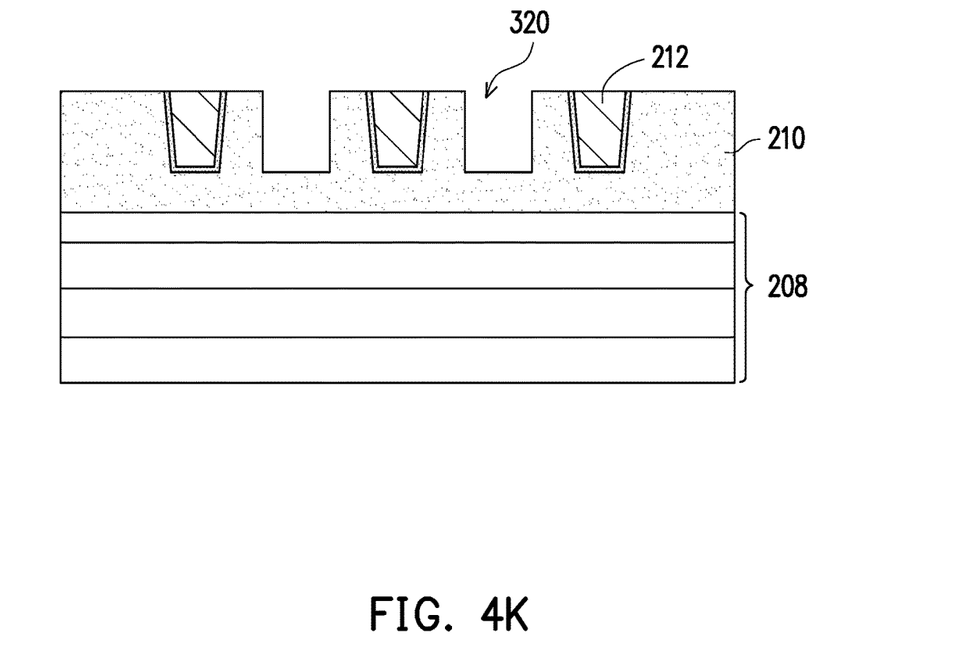

Referring to FIG. 4K, another polishing process is performed until the inter-layer dielectric layer 210 is exposed. The trench metal layer 314 is polished and then a remain portion of the trench metal layer 314 in the inter-layer dielectric layer 210 is reserved and turns to the trench metal layer 212 serving as an interconnect structure in an embodiment. The air trench 320 still exists in the trench metal layer 212 between adjacent two of the trench metal layers 212 is formed. The air trench 320 does not contact to the trench metal layer 212 in the embodiment. The trench metal layer 212 can keep well without damage. The potential damage due to previous fabrication processes can be effectively excluded.

Figure 4L:
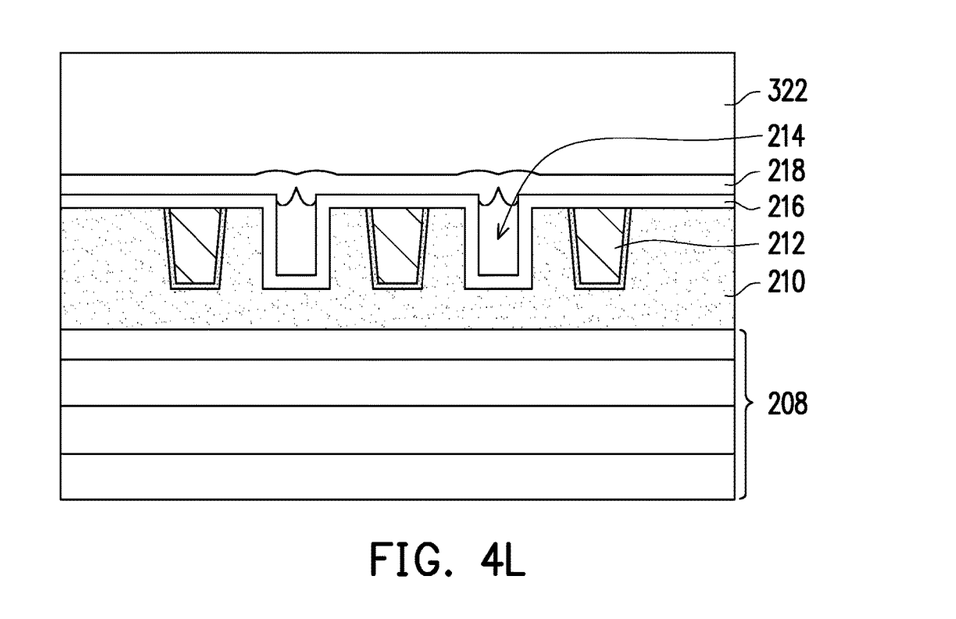

Referring to FIG. 4L, similar to FIG. 3, a liner layer 216 in conformal shape over the substrate 208 is formed to cover the trench metal layer 212 and the profile of the air trench 320 in FIG. 4K. An etching stop layer 218 is formed on the liner layer 216, in which the air trench 320 is sealed by the etching stop layer 218. As a result, the air gap 214 is formed after sealing the air trench 320 by the etching stop layer 218. Then a second inter-layer dielectric layer 322 can be further formed over the substrate 208.

As described above, the invention can have well topography for the trench metal layer 212. In addition, the etching stop layer 218 can have a uniform thickness over the trench metal layer 212. The vertical parasitic capacitance for each trench metal layer 212 can have well control.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure of semiconductor device, comprising:
a substrate;
a first dielectric layer, disposed over the substrate, wherein the first dielectric layer has an air trench;
a plurality of trench metal layers, disposed in the first dielectric layer, wherein the air trench is between adjacent two of the trench metal layers and without contacting to the trench metal layers;
a liner layer, disposed on the first dielectric layer to cover the trench metal layers and a profile of the air trench; and
an etching stop layer, disposed on the liner layer, wherein the etching stop layer seals the air trench to form an air gap between the adjacent two of the trench metal layers.

2. The structure of semiconductor device in claim 1, wherein the high-K dielectric layer comprises an etching stop layer.

3. The structure of semiconductor device in claim 1, further comprising a second dielectric layer, disposed on the etching stop layer.

4. The structure of semiconductor device in claim 1, further comprising a stacked layer between the substrate and the first dielectric layer.

5. The structure of semiconductor device in claim 4, wherein the stacked layer comprises a pre-layer metal layer or a pre-structure at a stage of middle end of line.

6. The structure of semiconductor device in claim 1, wherein the trench metal layers have a flat top surface to join a top surface of the first dielectric layer.

7. The structure of semiconductor device in claim 1, wherein the first dielectric layer is a low-K dielectric material.

8. The structure of semiconductor device in claim 1, wherein a portion of the etching stop layer above the trench metal layer has a uniform thickness.

9. A method for fabricating semiconductor device, comprising:
providing a substrate;
forming a first dielectric layer, a mask layer and a sacrificial layer, sequentially stacked over the substrate;
patterning the sacrificial layer to form a plurality of mandrels on the mask layer;
forming a spacer on a sidewall of the mandrels;
performing an etching process to form a trench in the mask layer and the first dielectric layer, according to the mandrels with the spacer used as an etching mask;
forming a plurality of trench metal layers to fill the trench;
forming a photoresist layer on the trench metal layers and the mandrels, wherein the photoresist layer has an opening to expose a selected portion of the mandrels;
removing the selected portion of the mandrels to have an exposed region of the mask layer;
forming an air trench in the mask layer and the first dielectric layer from the exposed region of the mask layer;
removing the photoresist layer;
polishing over the substrate until the first dielectric layer is exposed, wherein a remaining portion of the air trench is between adjacent two of the trench metal layers and without contacting to the trench metal layers;
forming a liner layer being conformal over a profile of the air trench; and
forming a high-K dielectric layer on the liner layer, wherein the air trench is sealed by the high-K dielectric layer to form an air gap.

10. The method for fabricating semiconductor device in claim 9, wherein the etching stop layer comprises a high-k dielectric, a nitrogen doped SiC, an oxygen doped SiC, or an aluminum nitride.

11. The method for fabricating semiconductor device in claim 9, further comprising forming a second dielectric layer on the etching stop layer.

12. The method for fabricating semiconductor device in claim 9, further comprising forming a stacked layer between the substrate and the first dielectric layer.

13. The method for fabricating semiconductor device in claim 12, wherein the stacked layer comprises a pre-layer metal layer or a pre-structure after a processing stage of middle end of line.

14. The method for fabricating semiconductor device in claim 9, wherein the trench metal layers have a flat top surface to join a top surface of the first dielectric layer after the step of polishing over the substrate.

15. The method for fabricating semiconductor device in claim 9, wherein the first dielectric layer is a low-K dielectric material.

16. The method for fabricating semiconductor device in claim 9, wherein the mask layer on the first dielectric layer is a single-layer structure or a multiple-layer structure.

17. The method for fabricating semiconductor device in claim 9, wherein the trench metal layers are copper.

18. The method for fabricating semiconductor device in claim 9, wherein a portion of the high-K dielectric layer above the trench metal layer has a uniform thickness.

19. The method for fabricating semiconductor device in claim 9, wherein a damage on the trench metal layers during the step of forming the air trench is excluded during the step of polishing over the substrate.

20. The method for fabricating semiconductor device in claim 9, wherein the step of performing the etching process to form the trench comprises:
a first etching stage to etch the mask layer using the mandrels with the spacer as the etching mask; and
a second etching stage to continuously etch down to the first dielectric layer.

* * * * *